US008970220B2

(12) United States Patent
Morrow et al.

(10) Patent No.: US 8,970,220 B2
(45) Date of Patent: Mar. 3, 2015

(54) LIGHTING TESTER

(75) Inventors: Jonathan P. Morrow, Mill Creek, WA (US); Evans H. Nguyen, Renton, WA (US); Hu Zenghong, Taian (CN); Lin Jianqin, Tianshui (CN)

(73) Assignee: Milwaukee Electric Tool Corporation, Brookfield, WI (US)

( * ) Notice: Subject to any disclaimer, the term of this patent is extended or adjusted under 35 U.S.C. 154(b) by 305 days.

(21) Appl. No.: 13/179,276

(22) Filed: Jul. 8, 2011

(65) Prior Publication Data
US 2012/0007602 A1 Jan. 12, 2012

Related U.S. Application Data

(60) Provisional application No. 61/362,924, filed on Jul. 9, 2010, provisional application No. 61/388,470, filed on Sep. 30, 2010.

(51) Int. Cl.
*G01R 31/44* (2006.01)
*G01R 31/24* (2006.01)
(Continued)

(52) U.S. Cl.
CPC ............... *G01R 31/24* (2013.01); *H05B 37/03* (2013.01); *H05B 41/2851* (2013.01); *G01R 31/44* (2013.01)
USPC ........................... 324/414; 324/403; 324/555

(58) Field of Classification Search
CPC ......... G01R 31/24; G01R 31/44; G01R 31/08
USPC ....... 324/99 D, 114, 115, 156, 149, 555, 556, 324/713, 403–415; 315/129; 343/901; 356/237.1, 432
See application file for complete search history.

(56) References Cited

U.S. PATENT DOCUMENTS

| 369,665 A | 9/1887 | Thompson |
| 1,457,597 A | 6/1923 | Ohmart |
| 1,821,240 A | 9/1931 | Seletzky |

(Continued)

FOREIGN PATENT DOCUMENTS

EP 0235873 9/1987

OTHER PUBLICATIONS

The Authoritative Dictionary of IEEE Standards Terms Seventh Edition (2007).*

(Continued)

*Primary Examiner* — Arleen M Vazquez
*Assistant Examiner* — Robert P Alejnikov, Jr.
(74) *Attorney, Agent, or Firm* — Michael Best & Friedrich LLP

(57) ABSTRACT

A combination lighting tester tool. The combination lighting tester tool includes at least three independent testing tools for identifying and diagnosing a problem in a lighting system. For example, the tester includes a lamp testing function in which a high voltage test signal is generated and transmitted using an antenna. When the test signal is in proximity to a gas filled lamp, the voltage is of sufficient magnitude to ionize the gas inside the lamp, causing the lamp to illuminate. The tester also includes a ballast testing function in which the power lines or wires connecting a ballast to a lamp or lighting fixture are tested, and a filament tester for testing the filaments in a lamp for continuity or resistance. The tester also includes a worklight for illuminating an area under test and one or more display devices (e.g., LEDs, an LCD display, or the like) which provide an indication of, for example, a test being performed or a result of a test.

25 Claims, 14 Drawing Sheets

(51) Int. Cl.
*H05B 37/03* (2006.01)
*H05B 41/285* (2006.01)

(56) References Cited

U.S. PATENT DOCUMENTS

| | | | |
|---|---|---|---|
| 1,955,794 A | 4/1934 | Du Mont et al. | |
| 2,155,778 A | 4/1939 | Stratton | |
| 2,501,548 A | 3/1950 | Street | |
| 2,708,735 A | 5/1955 | Sparr | |
| 2,746,011 A | 5/1956 | Carson | |
| 2,767,325 A | 10/1956 | Harjes et al. | |
| 2,797,413 A * | 6/1957 | Cone | 343/901 |
| 3,003,634 A | 10/1961 | Snyder et al. | |
| 3,214,689 A | 10/1965 | Outen | |
| 3,281,671 A | 10/1966 | Hughson | |
| 3,407,123 A | 10/1968 | Peterson | |
| 3,688,185 A * | 8/1972 | Masengil | 324/414 |
| 3,725,780 A | 4/1973 | Olin | |
| 3,788,724 A | 1/1974 | Schenkels et al. | |
| 3,840,801 A | 10/1974 | Kellogg et al. | |
| 3,939,398 A | 2/1976 | Kellogg | |
| 3,967,191 A | 6/1976 | Roche | |
| 4,238,728 A | 12/1980 | Wells, Jr. et al. | |
| 4,494,042 A | 1/1985 | Roche | |
| 4,496,905 A | 1/1985 | Forte et al. | |
| 4,529,912 A | 7/1985 | Northrup et al. | |
| 4,590,429 A | 5/1986 | Sell | |
| 4,603,333 A * | 7/1986 | Carlson | 343/709 |
| 4,617,519 A | 10/1986 | Rosenthal | |
| 4,742,360 A * | 5/1988 | Carolus et al. | 343/903 |
| 4,779,739 A | 10/1988 | Carl et al. | |
| 4,842,147 A | 6/1989 | Carl et al. | |
| 4,922,185 A | 5/1990 | Davidson et al. | |
| 4,943,752 A | 7/1990 | Todd et al. | |
| 5,008,626 A | 4/1991 | Boyd, Sr. | |
| 5,179,339 A | 1/1993 | Volk, Jr. | |
| 5,319,312 A | 6/1994 | Segilia | |
| 5,323,116 A | 6/1994 | Atria | |
| 5,369,363 A | 11/1994 | Hey | |
| 5,434,510 A | 7/1995 | Halstead | |
| 5,453,683 A | 9/1995 | Pagano | |
| 5,528,147 A | 6/1996 | Konopka | |
| 5,539,317 A | 7/1996 | Janning | |
| 5,666,029 A | 9/1997 | McDonald | |
| 5,672,964 A * | 9/1997 | Vinci | 324/72.5 |
| 5,952,832 A | 9/1999 | Stevanovic et al. | |
| 6,218,824 B1 * | 4/2001 | Oldstead et al. | 324/115 |
| 6,448,779 B1 * | 9/2002 | Beaver et al. | 324/504 |
| 6,480,001 B2 | 11/2002 | Frederick | |
| 6,534,988 B2 | 3/2003 | Flory, IV | |
| 6,603,302 B2 | 8/2003 | Prineppi | |
| 6,682,381 B1 | 1/2004 | Michael | |
| 6,722,184 B2 | 4/2004 | Bennett et al. | |
| 6,734,678 B2 | 5/2004 | Frederick | |
| 6,777,942 B2 | 8/2004 | Schadhauser | |
| 6,784,667 B2 | 8/2004 | Belenger et al. | |
| 6,812,685 B2 * | 11/2004 | Steber et al. | 324/72.5 |
| 6,937,208 B2 * | 8/2005 | Ohno et al. | 343/895 |
| 6,967,445 B1 | 11/2005 | Jewell et al. | |
| 6,972,570 B2 * | 12/2005 | Schriefer | 324/414 |
| 7,034,543 B2 | 4/2006 | Iwasawa | |
| 7,049,822 B2 | 5/2006 | Kung | |
| 7,064,554 B2 | 6/2006 | Moore | |
| 7,145,342 B2 | 12/2006 | Wendt et al. | |
| 7,250,769 B1 | 7/2007 | Olson | |
| 7,432,722 B2 | 10/2008 | Jacques | |
| 7,664,573 B2 * | 2/2010 | Ahmed | 700/276 |
| 2002/0109508 A1 | 8/2002 | Huang | |
| 2003/0025492 A1 | 2/2003 | Prineppi | |
| 2005/0174122 A1 | 8/2005 | Schriefer | |
| 2006/0080885 A1 * | 4/2006 | Wisocki | 43/18.1 R |
| 2007/0296418 A1 | 12/2007 | Jacques | |
| 2008/0061791 A1 | 3/2008 | Joos et al. | |
| 2008/0092675 A1 * | 4/2008 | Komine | 74/5.4 |
| 2008/0315885 A1 * | 12/2008 | Andresen et al. | 324/414 |
| 2009/0080683 A1 * | 3/2009 | Bevirt et al. | 381/367 |

OTHER PUBLICATIONS

GTI Products, Time Saving Tools for Contractors, Flicker—Faulty Lamp Indicator, bulletin, 2009, 2 pages, www.gtiproducts.com/products.
GTI Products, Time Saving Tools for Contractors, Electronic Ballast Tester, bulletin, 2009, 2 pages, www.gtiproducts.com/products.
Greenlee Textron Inc., Gas Lamp Tester, bulletin, 2010, 1 page, www.mygreenlee.com/GreenleeDotcom/Products.
Greenlee Textron, "Instruction Manual Gas Lamp Tester, Model 5715" 1988, 2 pages.

* cited by examiner

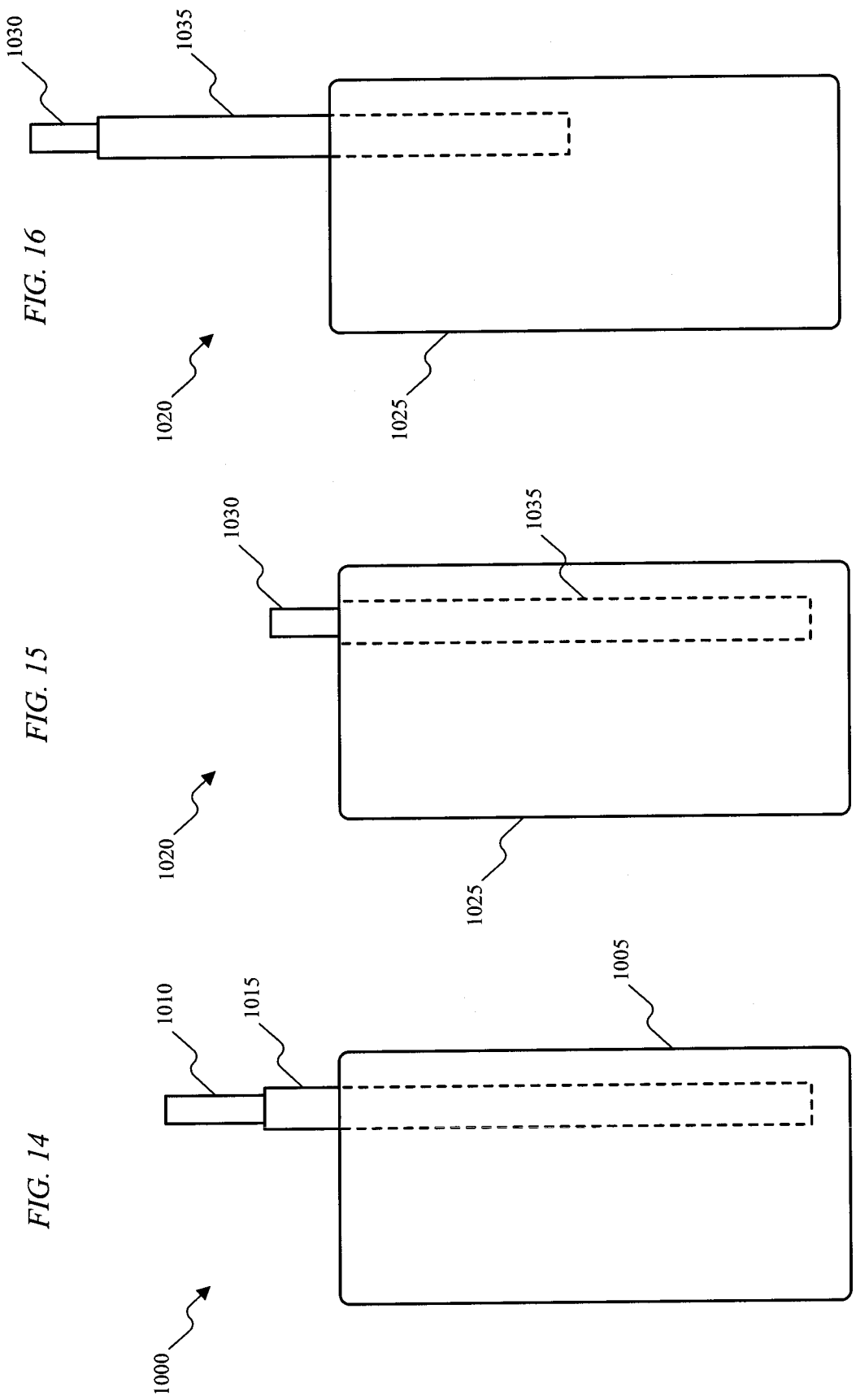

LIGHTING TESTER

RELATED APPLICATIONS

This application claims the benefit of prior-filed, U.S. Provisional Patent Application No. 61/362,924, filed Jul. 9, 2010 and prior-filed, U.S. Provisional Patent Application No. 61/388,470, filed Sep. 30, 2010, the entire contents of both of which are hereby incorporated by reference.

BACKGROUND

Commercial lighting consists primarily of gas-filled fluorescent lamps, which are a family of artificial light sources that generate light by sending an electrical discharge through an ionized gas (i.e., a plasma). Typically, these lamps are filled with noble gases such as argon, neon, krypton, and xenon, or a mixture of such gases. Many lamps are also filled with additional materials such as mercury, sodium, or metal halides. In operation, the gas is ionized, electrons are accelerated by an electrical field within the lamp, and the electrons collide with gas and metal atoms. Ultraviolet radiation resulting from these collisions is converted to visible light by a fluorescent coating on the inside of the lamp's glass surface.

There are three primary categories of gas-discharge fluorescent lamps. Low-pressure discharge lamps are commonly used as, for example, office lighting. Each low-pressure discharge lamp has a luminous efficacy of approximately 100 lumens per watt ("lm/W") or more. For example, low-pressure sodium-vapor lamps are the most efficient of the gas-discharge type fluorescent lamps and have a luminous efficacy of up to 200 lm/W. However, the efficiency of the low-pressure sodium-vapor lamps is offset by poor color rendering. In many instances, nearly monochromatic yellow light is produced.

High-pressure discharge fluorescent lamps, such as metal halide lamps, are capable of producing an output which is approximately white light and have a luminous efficacy of approximately 100 lm/W. Applications of high-pressure discharge fluorescent lamps include indoor lighting of commercial buildings, parking lot lighting, and venue lighting (e.g., sporting venue lighting). High-pressure sodium-vapor lamps have a luminous efficacy of up to 150 lm/W and produce a broader light spectrum (i.e., produce more wavelengths of visible light) than the low-pressure sodium-vapor lamps.

High-intensity discharge ("HID") fluorescent lamps are a type of lamp which produces light by way of an electric arc between tungsten electrodes housed inside a translucent or transparent fused quartz or fused alumina arc tube. The tube is filled with gas and metal salts. The gas facilitates the arc's initial strike, and once the arc is started, it heats and evaporates the metal salts to form a plasma that increases the intensity of the light produced.

SUMMARY

Electricians, maintenance technicians, and repair technicians often diagnose problems with a lighting system using trial and error analysis. First, a fluorescent bulb is replaced. If the lighting problem persists, a ballast is replaced. If replacing the ballast does not fix the lighting problem, an attempt is made to identify a wiring problem using, for example, a digital multimeter ("DMM") or voltage detector, and interrupting power to the lighting system in the process.

This invention provides a lighting tester that is capable of testing a lighting system for a variety of potential problems. For example, the lighting tester is capable of performing a lamp test to determine whether a lamp is filled with gas, a ballast test to determine whether the ballast is supplying a proper amount of power at a proper frequency to the lamp, and a filament test to determine whether a filament at either end of the lamp is intact. These testing capabilities are combined with a high-powered worklight which enables the operation of the lighting tester in dark environments.

In one embodiment, the invention provides a lighting tester that includes a first test circuit, a second test circuit, a third test circuit, and a worklight. The first test circuit, the second test circuit, the third test circuit, and the worklight are selectively powerable by actuation of one or more switches. The first test circuit is configured to enable the lighting tester to test for the presence of gas in a lamp, the second test circuit is configured to enable the lighting tester to test for a faulty ballast, and the third test circuit is configured to enable the lighting tester to test a filament of the lamp. The lighting tester also includes one or more display devices and audio components (e.g., LEDs, an LCD display, speakers, buzzers, or the like) which provide an indication of, for example, a test being performed or a result of a test.

In another embodiment, the invention provides a lighting tester for testing one or more types of lamps. The lighting tester includes an antenna, a housing containing a first test circuit, a second test circuit, and a third test circuit, a worklight, and at least one display device. The first test circuit is configured to generate a test voltage signal. The test voltage signal is capable of being applied via the antenna to a lamp and ionizing a gas within the lamp. The second test circuit is configured to receive a signal associated with a lighting ballast and determine whether the signal is indicative of a high-frequency voltage generated by the lighting ballast. The third test circuit is configured to receive a first terminal and a second terminal of the lamp and test a filament of the lamp for continuity. The worklight is configured for use in conjunction with at least one of the first test circuit, the second test circuit, and the third test circuit. The at least one output device is configured to provide a signal indicative of the operation of at least one of the first test circuit, the second test circuit, and the third test circuit.

In another embodiment, the invention provides a lighting tester for testing one or more types of lamps. The lighting tester includes a housing containing a first test circuit, a second test circuit, and a third test circuit, and an antenna. The first test circuit is configured to generate a test voltage signal. The test voltage signal is capable of being applied to a lamp and ionizing a gas within the lamp. The second test circuit is configured to receive a signal associated with a lighting ballast and determine whether the signal is indicative of a high-frequency voltage generated by the lighting ballast. The third test circuit is configured to receive a first terminal and a second terminal of the lamp and test a filament of the lamp for continuity. The antenna includes a first pull-out shaft and a second pull-out shaft. At least one of the first pull-out shaft and the second pull-out shaft is coated with an insulating material, and the first pull-out shaft is configured to be in electrical communication with the second pull-out shaft. The first pull-out shaft is the first of the first and second pull-out shafts to be extended from the lighting tester, and the first pull-out shaft is the last of the first and second pull-out shafts to retract into the lighting tester.

In another embodiment, the invention provides a lighting tester for testing one or more types of lamps. The lighting tester includes an antenna, a housing containing a first test circuit, a second test circuit, and a third test circuit, and a worklight. The antenna includes a first pull-out shaft and a second pull-out shaft. At least one of the first pull-out shaft and the second pull-out shaft is coated with an insulating material, and the first pull-out shaft is in electrical communication with the second pull-out shaft. The first test circuit is configured to generate a test voltage signal. The test voltage signal is capable of being applied via the antenna to a lamp and ionizing a gas within the lamp. The second test circuit is configured to receive a signal associated with a lighting ballast and determine whether the signal is indicative of a high-frequency voltage generated by the lighting ballast. The third test circuit is configured to receive a first terminal and a second terminal of the lamp and test a filament of the lamp for continuity. The worklight is configured for use in conjunction with at least one of the first test circuit, the second test circuit, and the third test circuit.

Other aspects of the invention will become apparent by consideration of the detailed description and accompanying drawings.

BRIEF DESCRIPTION OF THE DRAWINGS

FIG. 14 illustrates a lighting tester according to an embodiment of the invention.
FIGS. 15-16 illustrate a lighting tester according to another embodiment of the invention.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

Embodiments of the invention described herein relate to a combination lighting tester tool ("the tester"). The tester includes at least three testing tools for identifying and diagnosing a problem in a lighting system. For example, the tester includes a lamp testing function in which a high-voltage test signal is generated and transmitted using an antenna. When the test signal is in proximity to a gas filled lamp (e.g., a neon, argon, xenon, krypton, mercury-vapor, sodium-vapor, etc.) the voltage is of sufficient magnitude to ionize the gas inside the lamp, causing the lamp to illuminate. When performing the lamp testing function, the tester functions as a portable electronic ballast. The tester also includes a ballast testing function in which the power lines or wires connecting a ballast to a lamp or lighting fixture are tested, and a filament testing function in which the filaments in a lamp are tested for continuity or resistance. The tester also includes a worklight for illuminating an area under test, and one or more display devices (e.g., LEDs, an LCD display, or the like) which provide an indication of, for example, a test being performed or a result of a test.

Figure 1:
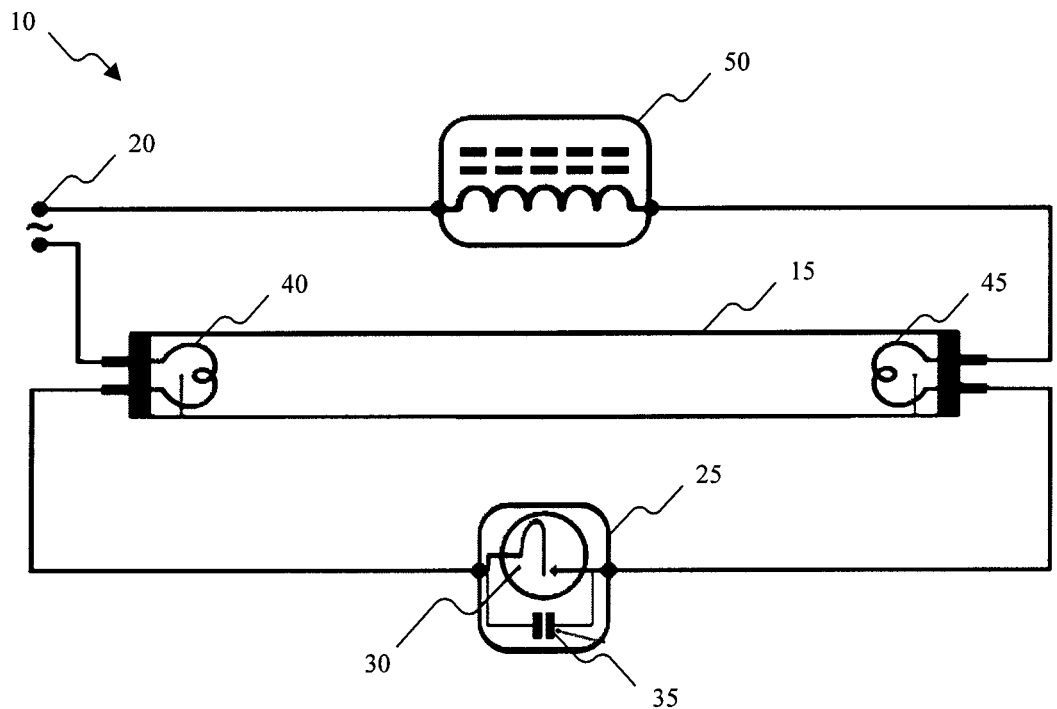
FIG. 1 illustrates a common lighting system.

FIG. 1 illustrates a circuit 10 for common fluorescent lamp lighting systems. The circuit 10 includes a fluorescent lamp 15, a power source 20, a starter 25, a switch 30, a capacitor 35, a first filament 40, a second filament 45, and a ballast 50. When power is being supplied to the lamp 15, the ballast 50, the starter 25, and the filament 45 (e.g., a cathode) generate a high-frequency voltage which creates a strong electrical field and ionizes the gas in the lamp 15.

Figure 2:
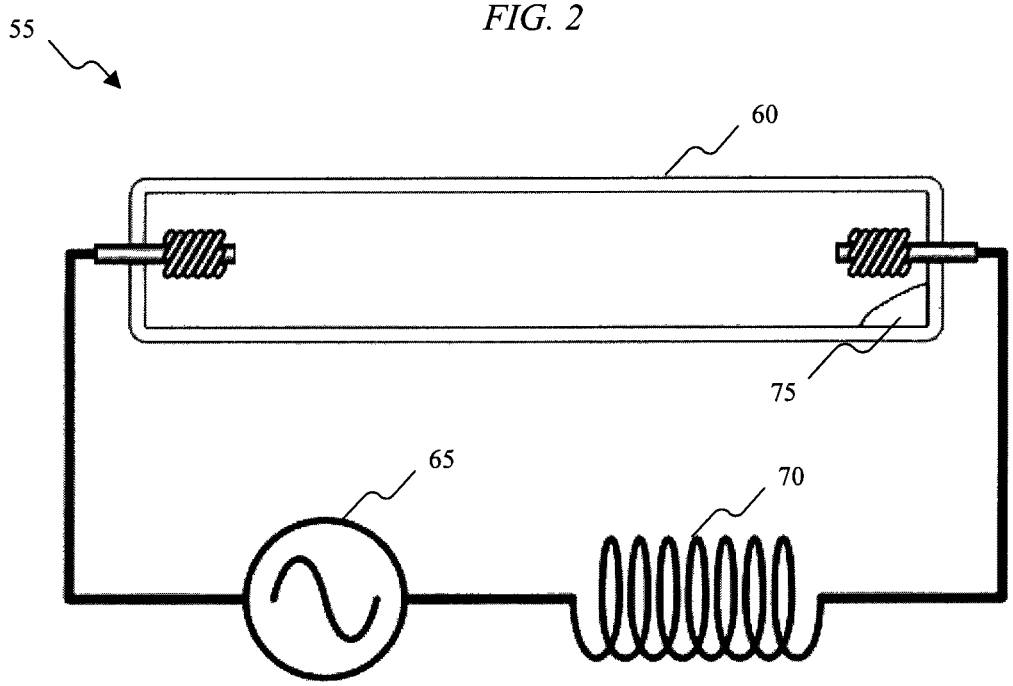
FIG. 2 illustrates another common lighting system.

FIG. 2 illustrates a circuit 55 for a common high-intensity discharge lamp lighting system. In the illustrated circuit 55, the lamp is a high-pressure sodium lamp 60. The circuit 55 includes the lamp 60, a power source 65, a ballast 70, and a sodium-mercury amalgam. In such a configuration, the starter, the switch, and the capacitor illustrated in the circuit 10 are excluded or included in, for example, the ballast 70.

Figure 3:
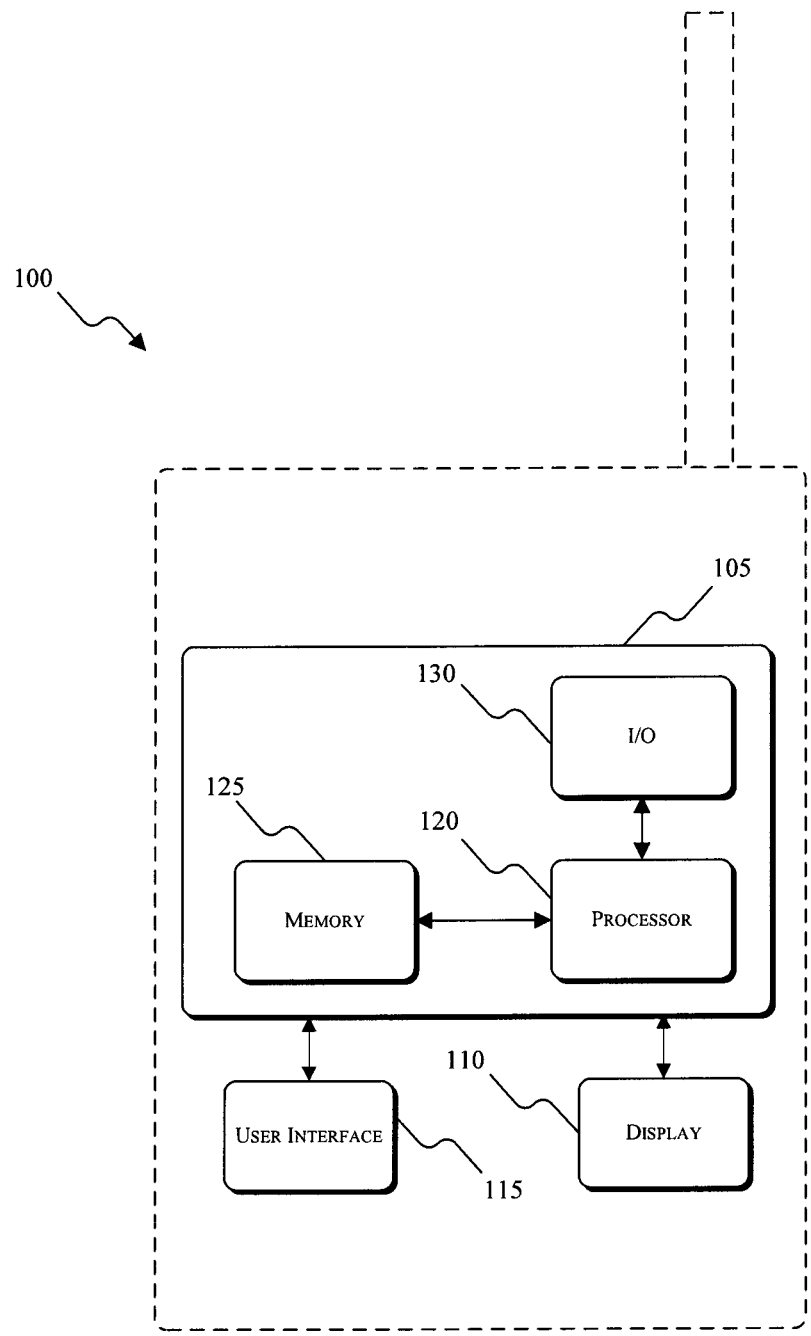
FIG. 3 illustrates a lighting tester according to an embodiment of the invention.

FIG. 3 illustrates a tester 100 that includes, among other things, a controller or control module 105, a display 110, and a user interface 115. The controller 105 includes a processor 120, a memory 125, such as a read-only memory ("ROM"), a random access memory ("RAM"), an electrically erasable programmable read-only memory ("EEPROM"), a flash memory, or the like, and an input/output ("I/O") interface 130. The user interface 115 is, for example, one or more switches, receptacles, antennas, or probes which are used to select and execute a variety of functions of the tester 100. The display 110 is, for example, one or more LEDs or an LCD which provides a user with information related to a test being performed, a result of the test being performed, or the like.

Figure 4:
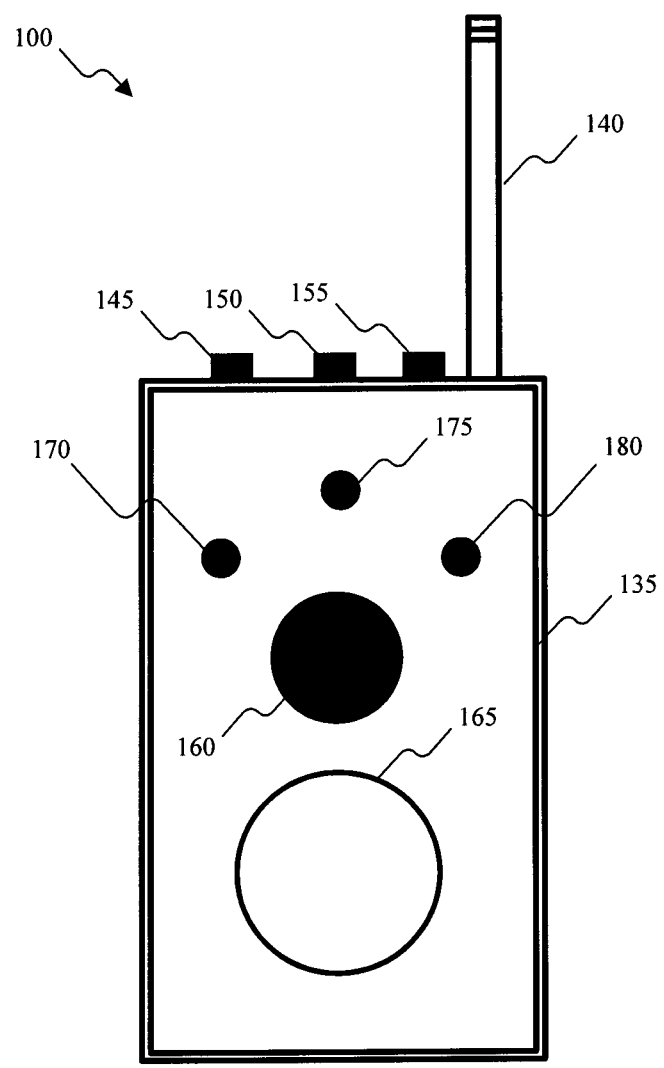
FIG. 4 is a front view of a lighting tester according to an embodiment of the invention.
Figure 5:
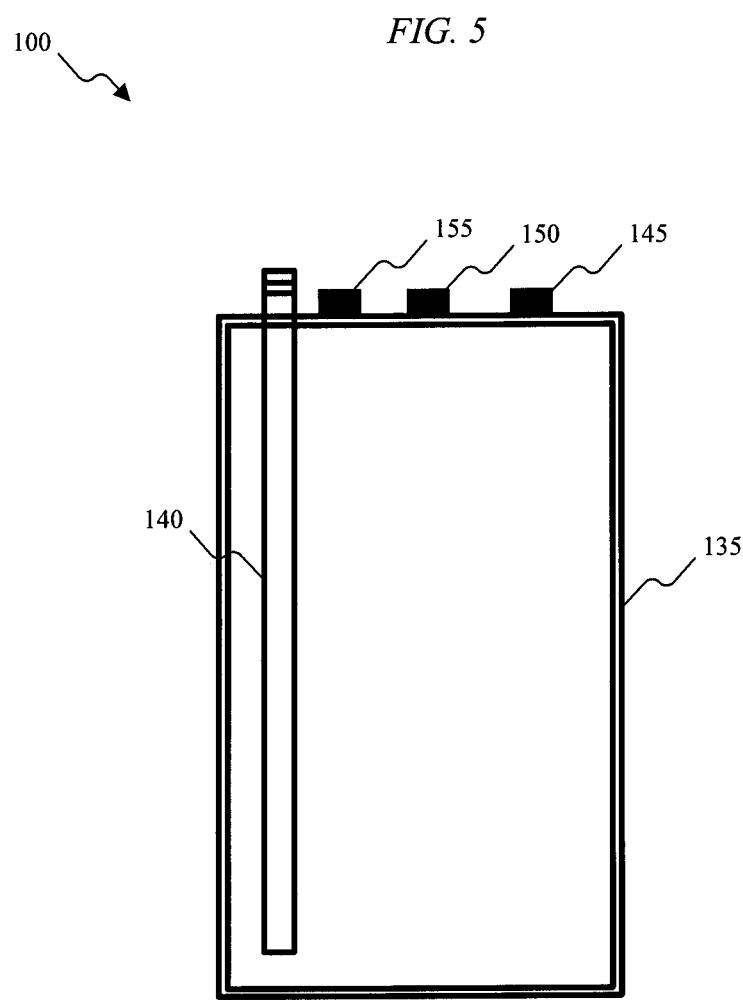
FIG. 5 is a rear view of the lighting tester of FIG. 4.

As illustrated in FIGS. 4 and 5, the tester 100 also includes a housing 135 and an antenna 140. In the illustrated tester 100, the user interface 115 includes a first function control switch 145, a second function control switch 150, a third function control switch 155, and a voltage enable switch 160. The display is illustrated as a first indicator LED 170, a second indicator LED 175, and a third indicator LED 180. Although not illustrated in FIG. 4 or 5, the tester 100 also includes a worklight and a power source, such as batteries or a battery pack. In embodiments of the invention which include batteries, the batteries are alkaline-based or lithium-based batteries and are, for example, disposable or rechargeable AA batteries, AAA batteries, six-volt ("6V") batteries, nine-volt ("9V") batteries, or the like. In embodiments of the invention including a battery pack, the battery pack includes one or more battery cells positioned within a battery pack housing. The battery pack is also compatible with other devices such as power tools (e.g., drills, saws, impact wrenches, etc.), inspection devices, test and measurement devices (e.g., digital multimeters, clamp meters, wall scanners, IR temperature guns, etc.), and the like. In some embodiments, the power source is configured to provide approximately forty hours of continuous use.

The battery cells within the battery pack provide operational power (e.g., DC power) to the tester 100. In one embodiment, each battery cell has a nominal voltage of approximately four-volts ("4.0V"), such that the battery pack has a nominal voltage of approximately twelve-volts ("12V"). The cells also have a capacity rating of approximately 1.4 Ah. In other embodiments, the battery pack has more or fewer battery cells, and the cells are arranged in series, parallel, or a series-parallel combination. For example, the battery pack can include a total of six battery cells in a parallel arrangement of two sets of three series-connected cells. The series-parallel combination of battery cells creates a battery pack having a nominal voltage of approximately 12V and a capacity rating of approximately 2.8 Ah. In some embodiments, the battery cells have different nominal voltages, such as, for example, 3.6V, 3.8V, 4.2V, etc., and/or have different capacity ratings, such as, for example, 1.2 Ah, 1.3 Ah, 2.0 Ah, 2.4 Ah, 2.6 Ah, 3.0 Ah, etc. In other embodiments, the battery pack has a different nominal voltage, such as, for example, 10.8V, 14.4V, etc. The battery cells are lithium-ion battery cells having a chemistry of, for example, lithium-cobalt ("Li—Co"), lithium-manganese ("Li—Mn"), or Li—Mn spinel. In some embodiments, the battery cells have other suitable lithium or lithium-based chemistries. In other embodiments, the battery cells have a nickel-cadmium ("NiCd") chemistry, a nickel-metal hydride ("NiMH") chemistry, or another suitable nickel-based chemistry.

The worklight provides a convenient source of light when operating the tester 100, because the tester 100 is often used to test faulty lighting systems and the testing environment is dark. In some embodiments, the worklight includes an incandescent light bulb, one or more LEDs, or the like. In one embodiment, the worklight includes three high-intensity LEDs and has an output of, for example, 250 LUX at a distance of two feet. As such, the worklight is sufficiently powerful to illuminate a four-foot area in front of the tester 100. Four feet is an approximation of the distance a typical user holds the lighting tester away from a ceiling or lighting fixture when using the lighting tester. In some embodiments of the invention, the output of the worklight is greater than 250 LUX at a distance of two feet. The worklight is either integral to or detachable from the tester 100. In embodiments of the invention in which the worklight is detachable from the tester 100, the worklight includes a secondary power source, and the tester 100 and the worklight include corresponding interfaces for attachment and detachment (e.g., flanges, tongues and grooves, magnets, etc.). The secondary power source is, for example, a battery that is electrically isolated from the tester 100, charged by the tester 100, or otherwise receives power from the tester 100 (e.g., wirelessly). The worklight also includes a worklight timeout period. The worklight timeout period has a preprogrammed value or the value is set by the user. If the worklight timeout period is reached or lapses and the worklight has not been turned off, the worklight is turned off to conserve power.

The antenna 140 is capable of being stowed in a recess or folded into a storage position, which allows for storage or transport of the tester 100 without damaging the antenna 140. For example, the antenna 140 is stored in a recess on a back, front, top, or side of the tester 100. Additionally or alternatively, the antenna 140 is held in a stowed position by, for example, a latch, a clip, or a suitable resilient holding member. The antenna 140 is also replaceable to facilitate repair.

A user selects a first test function using the first function control switch 145. In some embodiments, the first function control switch 145, the second function control switch 150, and the third function control switch 155 are combined using, for example, a single multi-stage switch (e.g., a rotary dial) or a touch-screen interface to control the power supplied to the various test circuits and the worklight. When a first test circuit (described below) is being powered, the first indicator LED 170 is illuminated. The first test function of the tester 100 is a test of the presence of gas for ionization in the lamp. A test voltage is applied to the fluorescent lamp to ionize the gas particles in a lamp. If the lamp lights up, gas is present. The first test is non-invasive and can be performed with the lamp in or out of a lighting fixture. The first test uses the antenna 140 to apply the test voltage to the lamp. The test voltage simulates the ballast by generating a strong electrical field at the antenna 140. When the antenna 140 is held in proximity to the lamp, the electric field ionizes the gas in the lamp and causes the lamp to illuminate. The first test is able to diagnose a lack of gas in the lamp. When testing fluorescent and compact fluorescent lamps, the first test is performed by bringing the antenna 140 in proximity to any area of the lamp, but is more effective the closer the antenna is to the ends of the lamp. For other types of lamps, such as sodium, halide, and mercury lamps, the first test is performed in proximity to the ends of the lamp.

Figure 6:
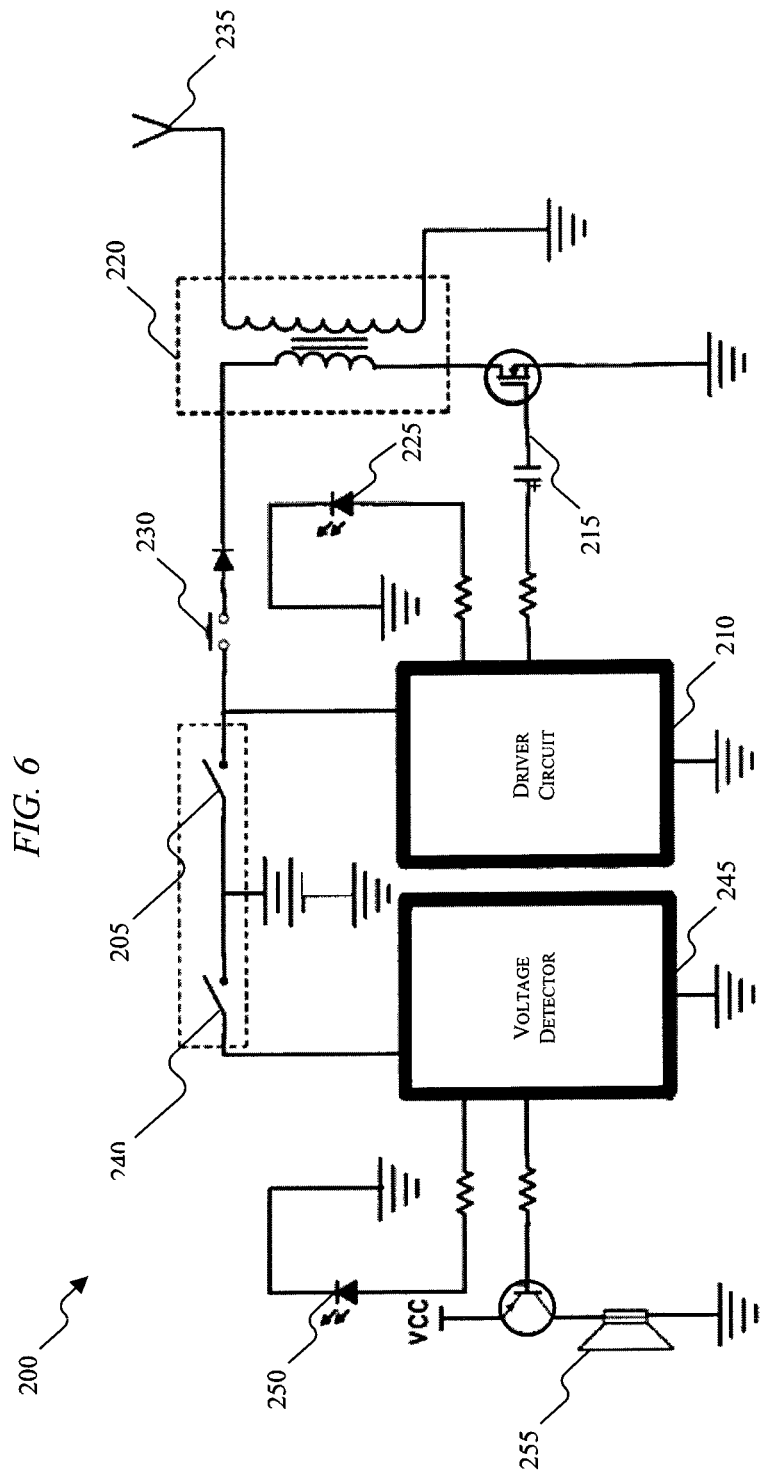
FIG. 6 illustrates a combination lighting test circuit according to an embodiment of the invention.

A circuit diagram 200 including the first test circuit is illustrated in FIG. 6. When performing the first test, a first function control switch 205 is closed and the circuit 200 generates a test voltage of approximately 2.5 kV or more that is pulsed (e.g., has a square-shaped waveform, a triangularly-shaped waveform, a trapezoidally-shaped waveform, a sinusoidally-shaped waveform, or the like) by an oscillating drive circuit 210 at a frequency of, for example, 20-50 kHz to drive a MOSFET 215. A transformer 220 transforms an input voltage of between approximately 1.5V and 9V to the 2.5 kV output voltage. The first indicator LED 225 is illuminated to provide an indication that the first test is being performed (e.g., the first test circuit is powered). The switch 230 is used to control the output of the test voltage. If the lamp is not filled with gas (e.g., the gas has leaked out) the lamp does not illuminate (e.g., does not flicker). If there is gas in the lamp, the pulse ionizes the gas and causes the lamp to illuminate. The first test is able to be performed with an antenna 235 in an extended position or in a retracted or stowed position without a significant variance in testing performance. However, the distance between the antenna 235 and the lamp has an impact on the results of the first test. Increasing the test voltage and pulse frequency cause the lamp to flicker at a greater intensity (e.g., the lamp is brighter), and the distance between the antenna and the lamp can be greater. However, increasing voltage and pulse frequency depletes the power source more quickly.

A user selects a second test function using the second function control switch 240, or a multi-stage switch as previously described. The second test function of the tester 100 is a ballast test which tests for the presence of electrical power and good electrical connections at the ends of a lighting fixture. The second test is performed when power is being supplied to the lighting fixture. The second test measures a voltage (e.g., magnitude or frequency) present at the ends of the lighting fixture. Additionally or alternatively, the second test detects the presence of an electromagnetic field at the ends of the lighting fixture. Embodiments of the invention provided herein are described with respect to a second test function which detects the presence of a high-frequency voltage.

The tester 100 is used to test for the presence of a high-frequency voltage at each end of the lighting fixture. If no high-frequency voltage is detected at either end of the lighting fixture, the ballast is not functioning properly. If a high-frequency voltage is detected at one end of the lighting fixture and not the other, the ballast is functional and one end of the lighting fixture is experiencing a problem. If a high-frequency voltage is detected at both ends of the lighting fixture, the ballast and the lighting fixture are each working correctly.

The circuit diagram 200 of FIG. 6 also includes the second test circuit. The antenna 235 receives a signal from the ballast indicative of the presence of a high-frequency voltage when the ballast is functioning properly. A circuit 245 processes the signal received by the antenna 235 and outputs a signal to drive an indicator, such as the second-function LED 250 or a buzzer 255. The indicator provides a user with a visual, auditory, or tactile indication of a high-frequency voltage at the ends of the lighting fixture. In some embodiments, the tester 100 also includes a non-contact voltage detection ("NCVD") circuit which is separate from the second test circuit. If the ballast is not functioning properly, the user receives no indication from the tester 100. The second test is performed with the antenna in the extended position or in the retracted or stowed position without a significant variance in testing performance. However, the distance between the antenna 235 and the lamp has an impact on the results of the second test.

The first and second tests described above are unable to diagnose other potential problems that occur in a lighting system. For example, it is possible that a lamp that passes the first test and the second test is still faulty. The tester 100 enables the user to diagnose additional lighting system problems using the lamp recess 165 to perform a third test. The third test is a continuity test which determines whether the filament at each end of the lamp is good (e.g., intact). In one embodiment, the lamp recess 165 is able to receive an end of the lamp being tested (e.g., the lamp terminals). The user inserts the lamp into the lamp recess 165 and, if the filament in the tested end of the lamp is intact, the third indicator LED 180 illuminates. If the filament of the tested end of the lamp is damaged, the third indicator LED 180 does not illuminate. In other embodiments, an alligator clip or test probes are included in or are attached to the tester 100 to measure and display, for example, the resistance of a filament.

Figure 7:
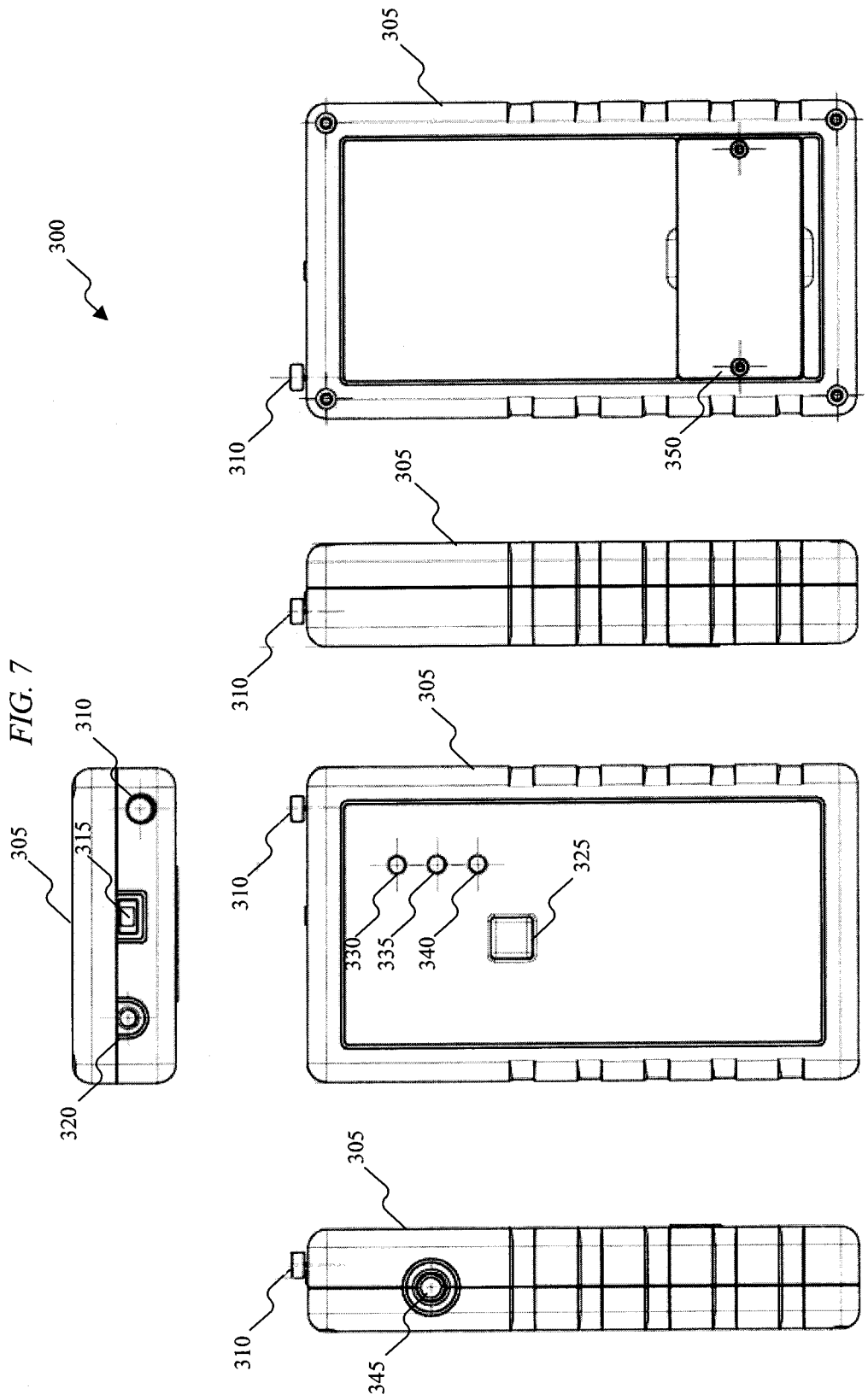
FIG. 7 illustrates a lighting tester according to an embodiment of the invention.

FIGS. 7-10 illustrate additional embodiments of the lighting tester. Each of the devices illustrated in FIGS. 7-10 are configured to meet a predetermined set of specifications. For example, the size and weight of the lighting tester is limited such that the device is capable of single-handed operation by a user. In some embodiments, the weight of the lighting tester is approximately eight ounces. In other embodiments, the weight of the lighting tester is in the range of approximately six ounces to approximately sixteen ounces. FIG. 7 illustrates a lighting tester 300. The lighting tester 300 is approximately rectangularly shaped and includes a housing 305, an antenna 310, a function selection switch 315, a worklight 320, a control button 325, a bulb test indicator 330, a ballast test indicator 335, an NCVD indicator 340, and a worklight button 345. A back-side of the housing 305 includes a covered portion 350 for receiving one or more batteries. In some embodiments, the housing 305 includes overmolded grips on the sides of the housing to increase the user's ability to grip the device.

The function selection switch 315 switches between an NCVD mode, a ballast test mode, and a bulb test mode (e.g., a flicker test mode) by selectively providing power to various portions of the lighting tester 300's internal circuitry, as described in greater detail below. In the illustrated embodiment, the NCVD mode is separate from the ballast test mode. For example, the NCVD mode and the ballast test mode each include dedicated circuitry, and the lighting tester 300 is capable of testing for the presence of voltage without performing the ballast test or using the antenna 310. In other embodiments, the NCVD test and the ballast test use the same circuitry. The NCVD indicator 340, the ballast test indicator 335, and the bulb test indicator 330 are also selectively illuminated depending on the state of the function selection switch 315. In some embodiments, the indicators 330-340 are continuously illuminated to provide the user with a continuous indication of the operational mode of the lighting tester 300. In other embodiments, the indicators 330-340 are illuminated for a predetermined period of time (e.g., three seconds) to provide a confirmation to the user that a particular testing mode has been selected. After the indicators 330-340 are subsequently turned off, they are configured to provide an indication to the user of the result of a test. For example, the NCVD indicator 340 is illuminated for a predetermined period of time when the user selects the NCVD testing function. After the predetermined period of time has elapsed and the indicator 340 has turned off, the indicator 340 illuminates when the antenna 310 detects the presence of a voltage. The control button 325 is used in conjunction with, for example, the bulb test mode to limit the user's exposure to the high output voltage of the test. In some embodiments, following the selection of the bulb testing mode, a testing voltage is not provided to the antenna 310 until the user selects the control button 325 (e.g., presses the control button). In some embodiments, the user selects the control button 325 to perform each of the lighting tester 300's testing functions.

Figure 8:
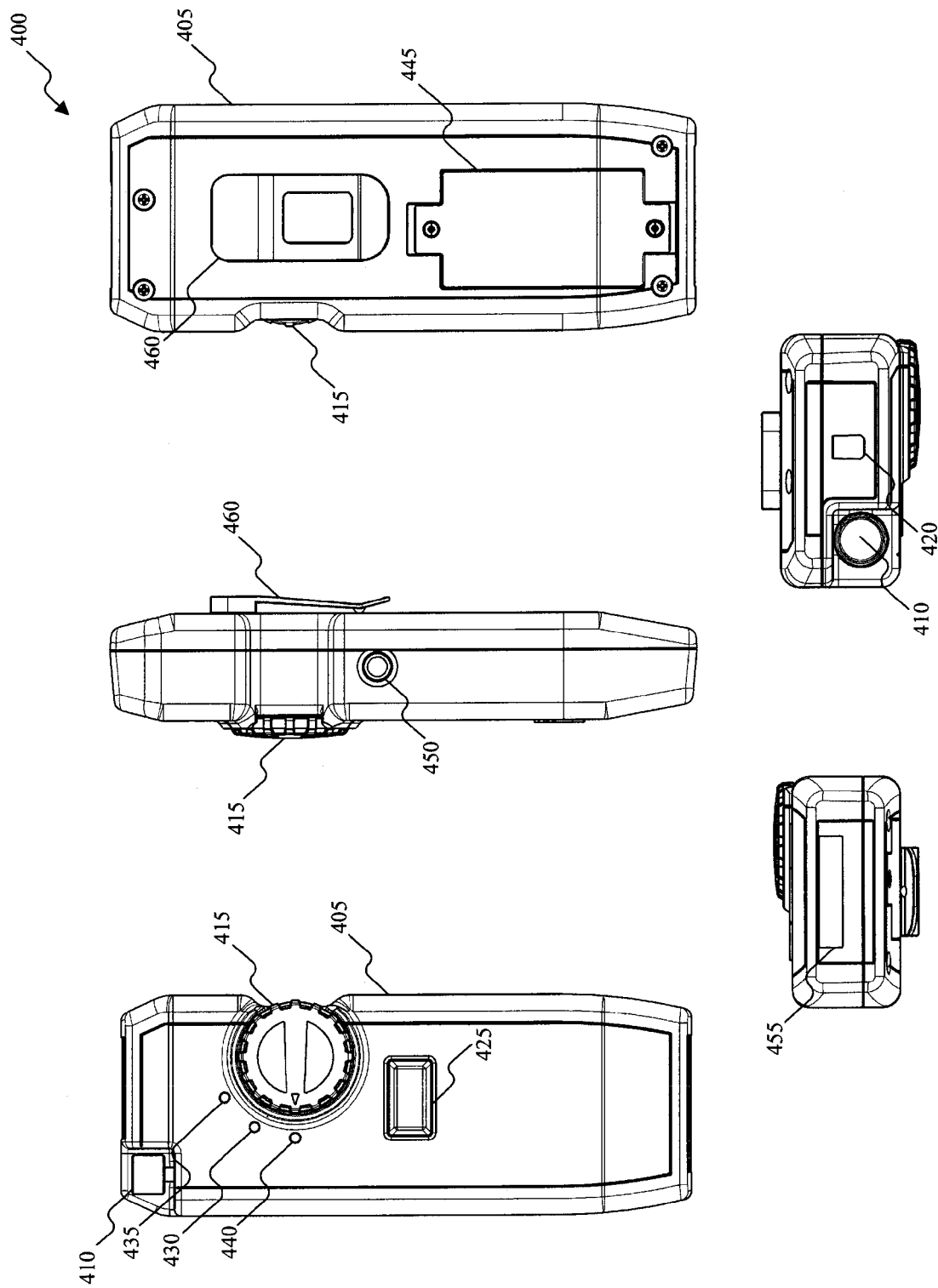
FIG. 8 illustrates a lighting tester according to an embodiment of the invention.

FIG. 8 illustrates a lighting tester 400. The lighting tester 400 is similar to the lighting tester 300 and includes a housing 405, an antenna 410, a function selection switch 415 (e.g., a dial), a worklight 420, a control button 425, a bulb test indicator 430, a ballast test indicator 435, a filament test indicator 440, a battery compartment 445, and a worklight button 450. The lighting tester 400 also includes a filament testing interface or recess 455. The filament testing interface 455 is configured to receive the terminals of a gas-filled bulb and test the filament at each end of the bulb for continuity. The filament testing interface 455 is configured to be compatible with any gas-filled bulb having pin-type end connectors. In some embodiments, the filament testing interface 455 includes a resizable opening for receiving various types of bulbs. In other embodiments, terminal sockets or receptacles are sized and spaced to receive the various types of terminal configurations of the gas-filled bulbs. The lighting tester 400 also includes a clip 460 for securing the lighting tester 400 to, for example, a belt or pocket of the user, a vehicle, a cart, or the like. In other embodiments, the lighting tester 400 includes one or more magnets for securing the lighting tester 400 to a metal object, wall, or the like.

Figure 9:
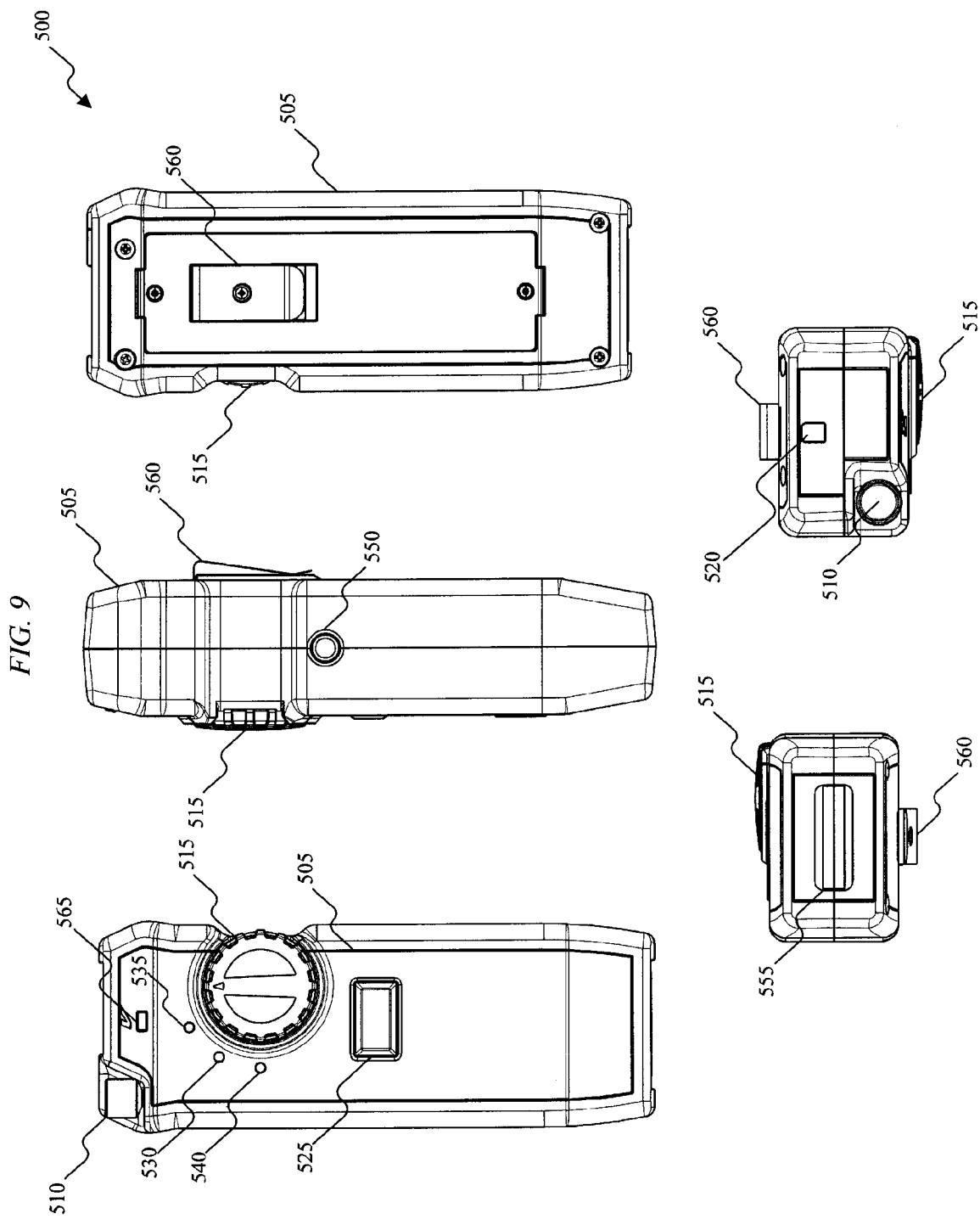
FIG. 9 illustrates a lighting tester according to an embodiment of the invention.

FIG. 9 illustrates a lighting tester 500. The lighting tester 500 is similar to the lighting tester 400 and includes a housing 505, an antenna 510, a function selection switch 515 (e.g., a dial), a worklight 520, a control button 525, a bulb test indicator 530, a ballast test indicator 535, a filament test indicator 540, a worklight button 550, a filament testing interface 555, and a clip 560. The lighting tester 500 also includes a voltage indicator LED 565. The voltage indicator LED 565 provides an indication to the user of the presence of a voltage. In some embodiments, non-contact voltage detection is built into the ballast testing function. In other embodiments, non-contact voltage detection is operative whenever the function control switch is not in an "OFF" position, unless a specific test prohibits the non-contact voltage detection.

Figure 10:
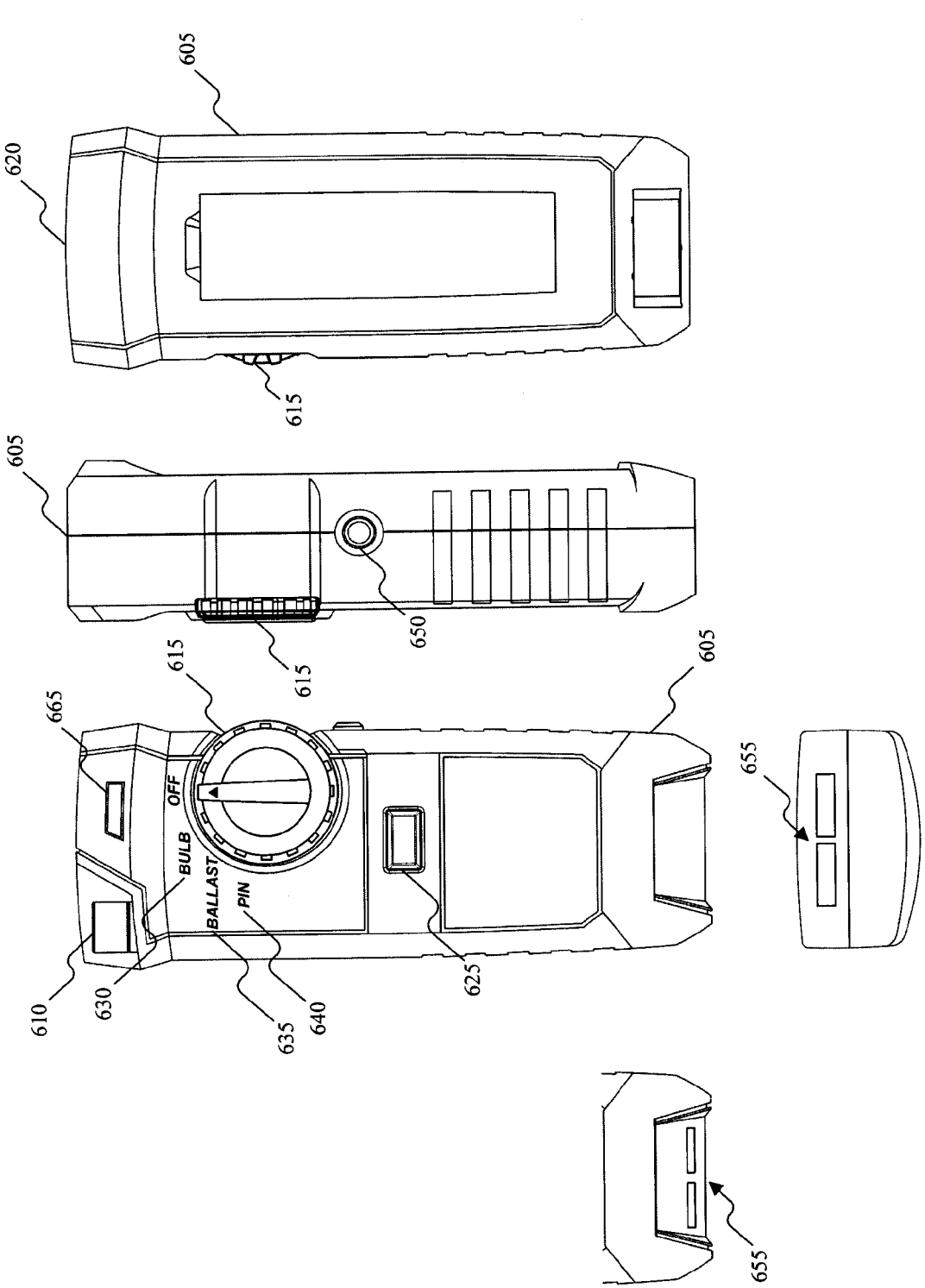
FIG. 10 illustrates a lighting tester according to an embodiment of the invention.

FIG. 10 illustrates a lighting tester 600. The lighting tester 600 is similar to the lighting tester 500 and includes a housing 605, an antenna 610, a function selection switch 615 (e.g., a dial), a worklight 620, a control button 625, a bulb test indicator 630, a ballast test indicator 635, a pin test indicator 640, a worklight button 650, and a pin testing interface 655. As illustrated in FIG. 10, the pin testing interface 655 is located near a bottom side of the tester 600. In some embodiments, the pin testing interface 655 is located on the bottom side of the tester 600. In other embodiments, the pin testing interface 655 is positioned on a lower end of a front side of the lighting tester 600. The lighting tester 600 also includes a voltage indicator LED 665. The voltage indicator LED 665 provides an indication to the user of the presence of a voltage. In some embodiments, non-contact voltage detection is built into the ballast testing function. In other embodiments, non-contact voltage detection is operative whenever the function control switch is not in an "OFF" position, unless a specific test prohibits the non-contact voltage detection.

Figure 11:
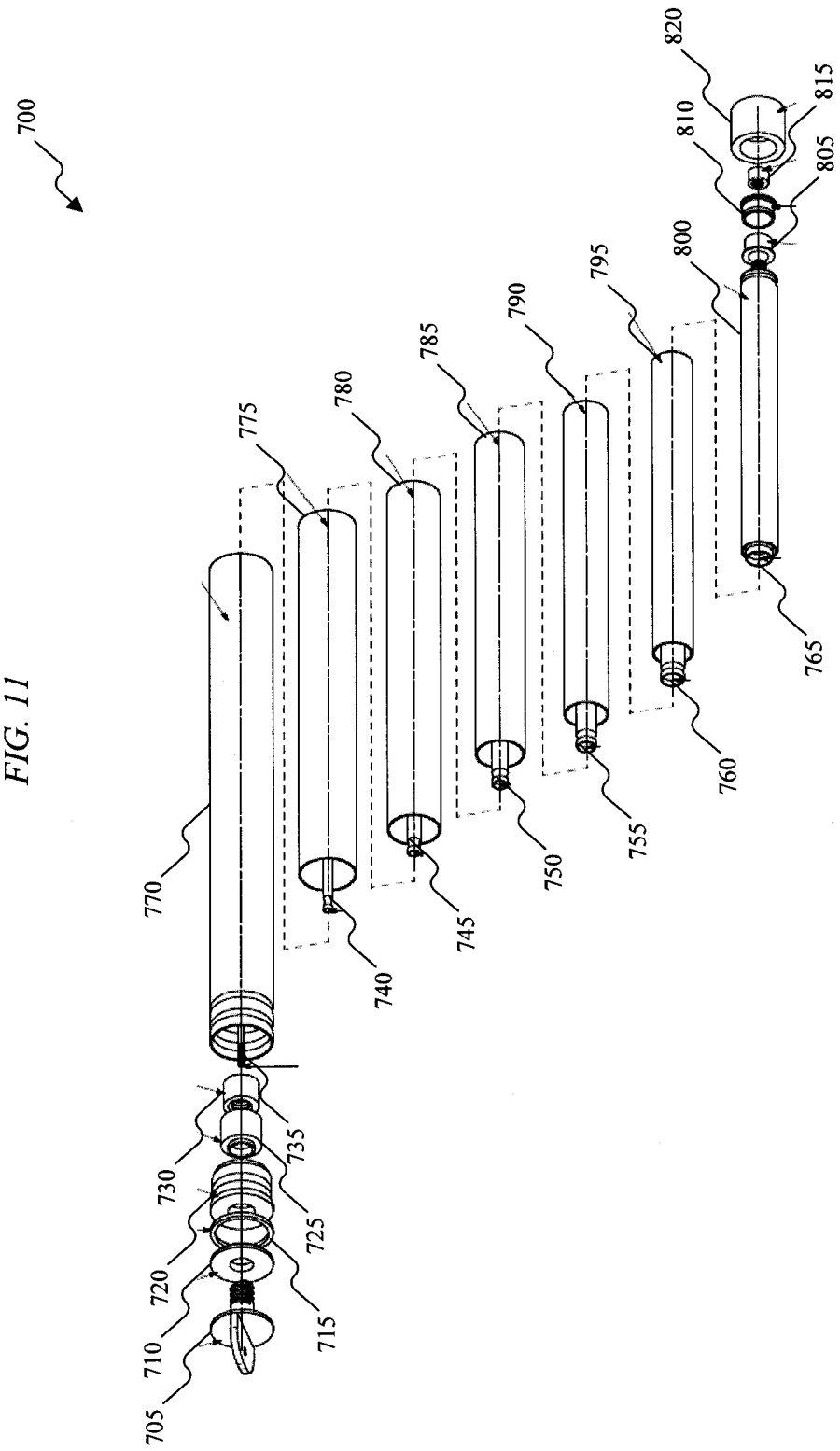
FIG. 11 illustrates an antenna according to an embodiment of the invention.

FIG. 11 illustrates an antenna 700 for use with any of the lighting testers 100, 300, 400, 500, and 600. The antenna 700 includes, for example, a plug 705, a first washer 710, a second washer 715, a first fixed housing 720, a sleeve 725, a nut 730, seven telescoping inner sleeve sections 735-765, seven telescoping outer sleeve sections 770-800, a second sleeve 805, a second fixed housing 810, a third sleeve 815, and an antenna head 820. The antenna 700 is configured to reduce the likelihood of injury to a user from the high-voltage outputs of the lighting tester. For example, the inner and outer sleeves are arranged coaxially with respect to one another. The outer sleeve sections are composed of, for example, stainless steel or another material which is relatively less conductive than the inner sleeve sections composed of, for example, brass. In some embodiments, the antenna is insulated to limit the conductivity of the outer sleeve sections 770-800. The stainless steel outer sleeve also prevents or reduces the likelihood of a user being hurt when coming in contact with the antenna 700 during the bulb test. In some embodiments, the antenna 700 has a fully-extended length of thirty inches. In other embodiments, longer or shorter antennas are used.

Figure 12:
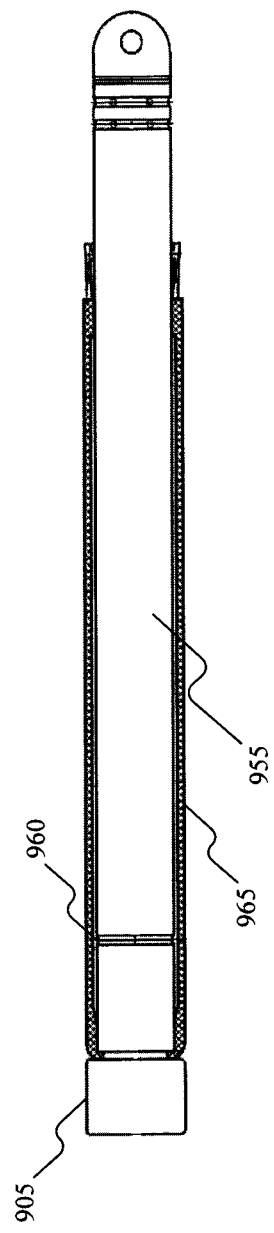
FIGS. 12-13 illustrate an antenna according to another embodiment of the invention.
Figure 13:
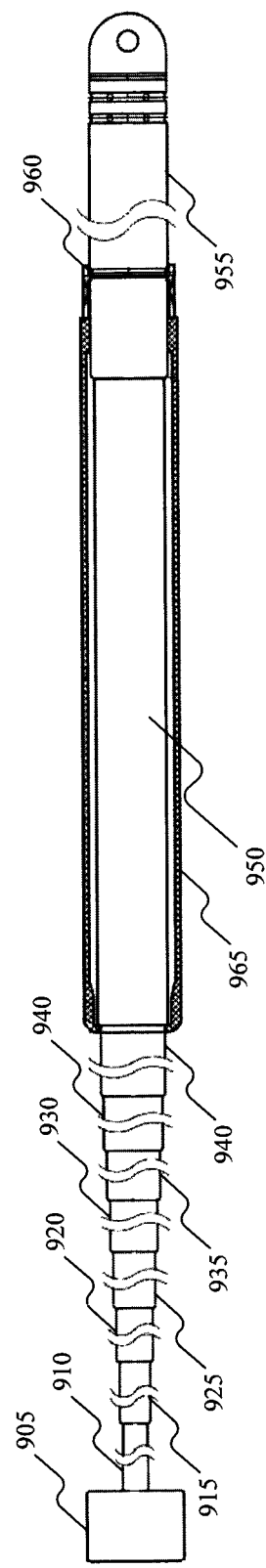

FIGS. 12 and 13 illustrate an antenna 900 for use with any of the lighting testers 100, 300, 400, 500, and 600. The antenna 900 includes, for example, an antenna head 905, a plurality of pull-out shafts 910-950, a fixed shaft 955, and a positioning groove 960. The antenna 900 is configured to reduce the likelihood of injury to a user from the high-voltage outputs of the lighting tester. For example, the first pull-out shaft 950 is covered or coated with an insulating material (e.g., a polyoxymethylene ("POM") plastic, a polypropylene ("PP") plastic, etc.) 965. The insulating material 965 reduces the likelihood of a user being shocked by a high voltage when using the lighting tester. In some embodiments, the first pull-out shaft 965 is the only pull-out shaft that is insulated. In other embodiments, additional pull-out shafts or all of the pull-out shafts 910-950 are insulated. The insulating material 965 is provided on an outer portion of the first pull-out shaft 950 and does not electrically isolate the first pull-out shaft 950 from the other pull-out shafts. As such, the pull-out shafts 910-950 are electrically connected to one another. The fixed shaft 955 is fastened or coupled to the lighting tester using a fastening device such as a screw, a bolt, or another suitable fastening device, and is configured to be detached from the lighting tester to allow for the easy replacement of one antenna for another.

The antenna 900 is extended and retracted manually by a user. The order in which the pull-out shafts 910-950 are extended is based on the pulling force required to overcome the frictional forces between adjacent pull-out sections. The pull-out shaft that requires the greatest force to pull out is the last portion of the antenna 900 to be extended. For example, the antenna 900 is configured to achieve a desired order for the pull-out shafts 910-950 to be extended or retracted based on the dimensions of the pull-out shafts 910-950, the weights of the pull-out shafts 910-950, the material(s) that the pull-out shafts 910-950 are made of, the shape of the pull-out shafts 910-950 (e.g. tapered), or the like. The insulated pull-out shaft 950 is the first shaft that is pulled out because it requires the least force to be extended. Additionally, because the pull-out shaft 950 is both insulated and the first pull-out shaft to be pulled out, the risk of a user being shocked while using the lighting tester is reduced. The antenna 900 is also configured such that the insulated pull-out shaft 950 is the last of the plurality of pull-out shafts 910-950 to be refracted (e.g., pushed in), which further reduces the risk of a user being shocked while using the lighting tester. The positioning groove 960 is configured to prevent the pull-out shafts 910-950 from being detached from the lighting tester. In some embodiments, a positioning groove is included on a plurality of the pull-out shafts 910-950 to prevent the pull-out shafts 910-950 from being detached from the lighting tester or the other pull-out shafts.

FIG. 14 illustrates a lighting tester 1000 that includes a housing 1005 and an antenna 1010, such as the antenna 900 illustrated in FIGS. 12 and 13. The antenna 1010 includes an insulating portion 1015. In the embodiment of the invention illustrated in FIG. 14, the insulating portion 1015 always extends at least partially out from the housing 1005. By always having at least a portion of the insulating material 1015 extend out of the housing 1005, the risk of a user accidentally touching the antenna 1010 and being shocked is reduced.

FIGS. 15 and 16 illustrate another lighting tester 1020. The lighting tester 1020 includes a housing 1025, an antenna 1030, and an insulating portion 1035. In the embodiment of the invention illustrated in FIG. 15, the insulating portion 1035 is located completely within the housing 1025. The insulating portion 1035 does not extend outside of the housing 1025 until the antenna 1030 is extended by a user, as illustrated in FIG. 16. As described above, the insulating portion 1035 (e.g., an insulated first pull-out shaft) is the first portion of the antenna 1030 to be extended out of the lighting tester 1020, as described above.

Figure 17:
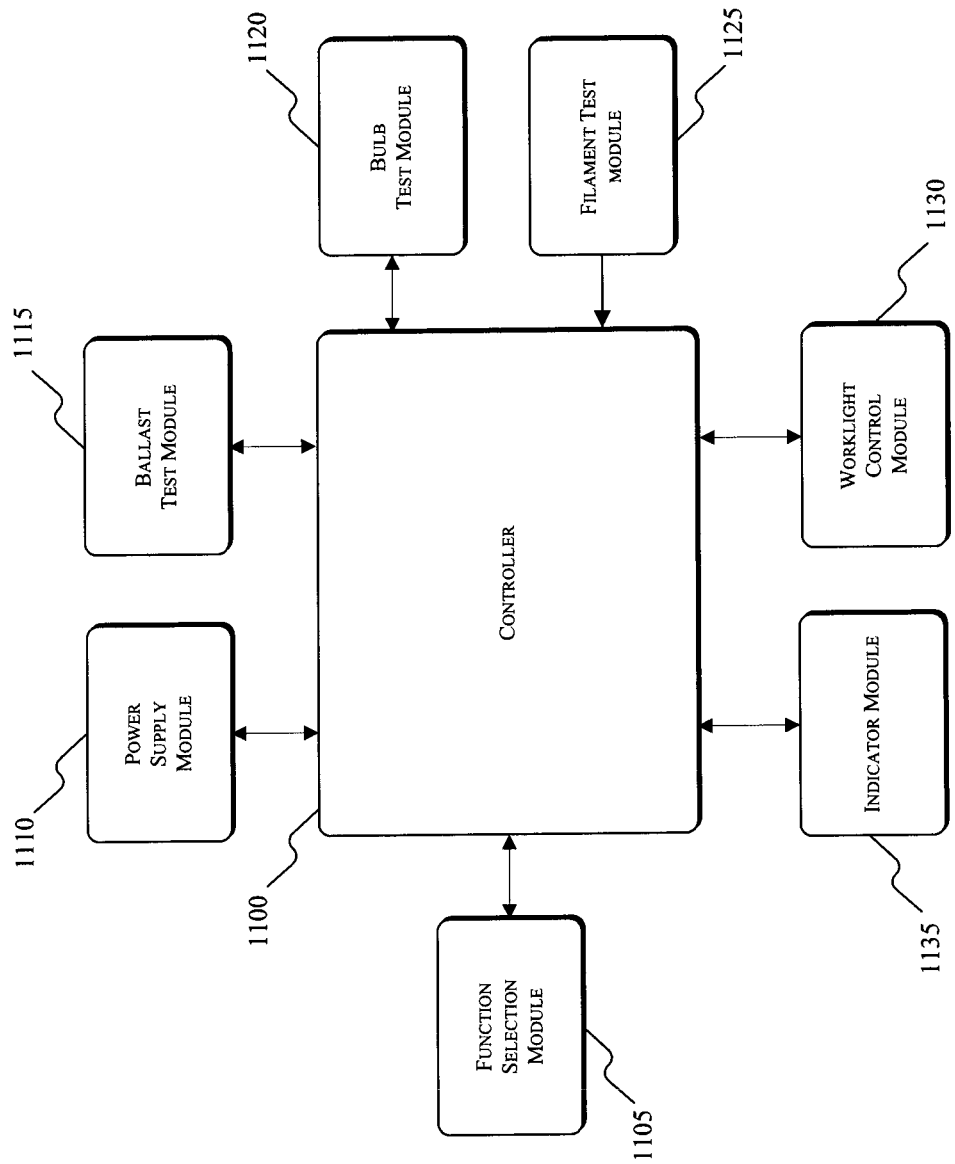
FIG. 17 is a block diagram of a lighting tester control system according to an embodiment of the invention.

The lighting testers 100, 300, 400, 500, and 600 include a plurality of modules for operatively controlling the testers. For example, the testers include a controller 1100 as illustrated in FIG. 17. The controller 1100 is connected to a plurality of additional control systems or modules within the testers, such as a function selection module 1105, a power supply module 1110, a ballast test module 1115, a bulb test module 1120, a filament test module 1125, a worklight control module 1130, and an indicator module 1135. Although the modules 1105-1135 are illustrated as being separate from and connected to the controller 1100, in some embodiments of the invention, one or more of the modules 1105-1135 are integrated into the controller 1100. Additionally, other embodiments of the invention include more, fewer, or different control modules coupled to or integrated with the controller 1100. The controller 1100, the modules 1105-1135, or combinations of the controller 1100 and modules 1105-1135 are used to execute the control and operational functions of the lighting testers described above.

The controller 1100 includes, for example, a printed circuit board ("PCB"). The PCB (not shown) is populated with a plurality of electrical and electronic components which provide operational control and protection to the testers 100, 300, 400, 500, and 600. In some embodiments, the PCB includes a control or processing unit such as a microprocessor, a microcontroller, or the like, a memory, and a bus. The bus connects various components of the controller 1100 including the memory to the processing unit. The memory includes, in many instances, read only memory ("ROM"), such as an electrically erasable programmable read-only memory ("EEPROM"), and random access memory ("RAM"). The controller 1100 also includes an input/output system that includes routines for transferring information between components within the controller 1100. Software included in the implementation of the testers 100, 300, 400, 500, and 600 is stored in the memory of the controller 1100. The software includes, for example, firmware applications and other executable instructions. In other embodiments, the controller 1100 can include additional, fewer, or different components.

The PCB also includes, among other things, a plurality of additional passive and active components such as resistors, capacitors, inductors, integrated circuits, and amplifiers. These components are arranged and connected to provide a plurality of functions to the PCB including, among other things, filtering, signal conditioning, and voltage regulation. For descriptive purposes, the PCB and the electrical components populated on the PCB are collectively referred to as "the controller" 1100. The controller 1100 receives signals from the sensors or components within the tester, conditions and processes the signals, and transmits processed and conditioned signals to, for example, the display, the indicators, etc.

In some embodiments, the modules 1105-1135 also include electric and electronic components similar to those described above with respect to the controller 1100 to perform or enable a variety of functions of the lighting testers 100, 300, 400, 500, and 600. For example, the function selection module 1105 is connected to the function selection buttons or the function selection dial described above. The function selection module 1105 provides signals to the controller 1100 related to a desired functional mode. The power supply module 1110 is connected to the lighting tester power source (e.g., batteries) and provides power from the batteries to various portions of the lighting tester including, among other things, the controller 1100, and the other modules. The bulb test module 1120 includes circuitry for performing the bulb testing function. For example, when a user selects the bulb test function using the function selection dial, an indication of this selection is provided to the controller 1100 via the function selection module 1105.

The controller 1100 selectively enables the bulb test module 1120 and provides power from the power supply module 1110 to the bulb test module 1120. The bulb test module 1120 is then able to execute the bulb test function described above. Similar processes are performed to execute the ballast test function by the ballast test module 1115 and the filament test by the filament test module 1125. The worklight control module 1130 is connected to the worklight button described above. When the user activates the worklight button, a signal from the worklight control module 1130 provides a signal to the controller 1100. The controller 1100 selectively provides power from the power supply module 1110 to the worklight control module 1130 for illuminating the worklight. The indicator module 1135 receives control signals from the controller 1100 and power from the power supply module 1110 sufficient to illuminate, for example, one or more LEDs or a display which provides an indication to the user of a result of a test. In some embodiments, the indicator module 1135 is incorporated into the various function testing modules (e.g., the bulb, ballast, and filament test modules 1115, 1120, and 1125) to provide an indication of the result of each test.

A person skilled in the art will recognize that, upon reading this specification, that the lighting testers 100, 300, 400, 500, and 600 can be implemented with different control systems. For example, in some embodiments, the function selection module 1105 is directly connected to the bulb test module 1120, the ballast test module 1115, and the filament test module 1125. In some embodiments, the power supply module 1110 is also directly connected to various others of the modules within the lighting testers 100, 300, 400, 500, and 600 such as the indicator module 1135, the bulb test module 1120, the ballast test module 1115, and the worklight control module 1130.

Figure 18:
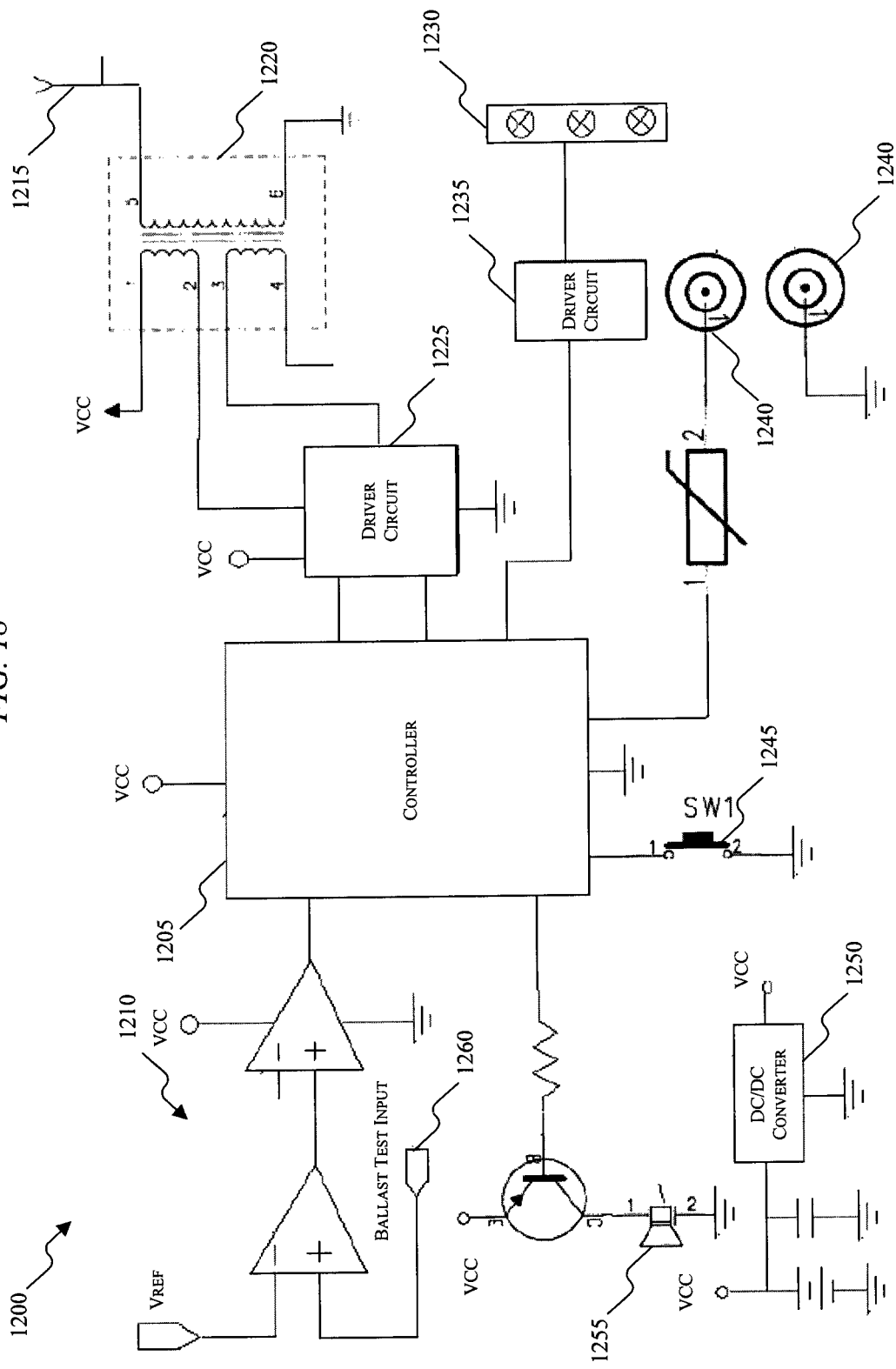
FIG. 18 is a lighting tester circuit block diagram according to an embodiment of the invention.

FIG. 18 illustrates a lighting tester circuit 1200. The circuit 1200 includes a controller 1205, a filter module 1210, a bulb test output 1215, a step-up transformer 1220, a transformer driver circuit 1225, indicators 1230, an indicator driver circuit 1235, filament test inputs 1240, a function actuator 1245, a DC-to-DC up-converter 1250, a buzzer 1255, and a ballast test input 1260. The controller 1205 includes similar components and operates in a similar manner to the controller 1100 described above. The filter module 1210 selects, for example, a frequency test range for the ballast test. The filter module 1210 functions as a low-pass filter, a high-pass filter, a band-pass filter, a band stop filter, etc. to achieve the desired testing functions of the lighting tester. In some embodiments, the filter module 1210 is configured as a band-pass filter and passes signals having frequencies between approximately 10 kHz and 100 kHz. The filtering is achieved using, for example, a plurality of resistors, capacitors, inductors, operational amplifiers, and the like. The bulb test output 1215 is, for example, an antenna which is used to apply a high-voltage output to a lamp under test. The bulb test output 1215 is connected to the step-up transformer 1220. In some embodiments, the step-up transformer 1220 transforms a voltage of between, for example, 1.5V and 12V to 2,600V. In other embodiments, different transformer ratios are used. The step-up transformer 1220 receives a driving voltage from the transformer driver circuit 1225. In some embodiments, the transformer driver circuit 1225 provides a pulse-width-modulated output signal having a frequency of, for example, 1 Hz. In other embodiments, voltages having sinusoidal, square, trapezoidal, triangular, or similarly shaped waveforms having different frequencies are output from the driver circuit 1225.

The indicators 1230 are, for example, LEDs and provide indications of an operational mode, a test result, or the like. In other embodiments, the indicators 1230 are virtual indicators provided on, for example, an LCD or similar type of display. The indicators 1230 are driven by an indicator driver circuit 1235, which provides signals to the indicators 1230 to selectively activate one or more of the indicators. The filament test inputs 1240 are configured to receive the terminals of, for example, a fluorescent lamp, and are connected to the controller 1205 via a resistor (e.g., a positive temperature coefficient resistor). In some embodiments, the inputs 1240 are configured to receive, for example, banana plugs or similar leads of a testing probe. The function actuator 1245 is, for example, a function test button or switch that is selected to activate one or more tests of the lighting tester. The DC-to-DC up-converter is used to up-convert a voltage from the batteries from, for example, 3V to 12V. The up-converted voltage is used to power various components and modules within the lighting tester, including the transformer driver circuit 1225 described above. The buzzer 1255 is included to provide an audible indication of various lighting tester test results, functions, or operations. For example, the buzzer 1255 is used to provide an audible indication of a need to replace batteries, an audible indication of a faulty lamp filament, an indication of a ballast that is functioning properly, or the like. The ballast test input 1260 is, for example, an antenna which is used to detect a voltage or an electromagnetic field having a frequency in the range of frequencies set by the filter module 1210.

Thus, the invention provides, among other things, a combination lighting tester that is able to quickly and efficiently diagnose a plurality of potential problems in a lighting system, a lighting fixture, or a lamp. Various features and advantages of the invention are set forth in the following claims.

What is claimed is:

1. A lighting tester for testing one or more types of lamps, the lighting tester comprising:
    a housing;
    an antenna coupled to the housing and including a first pull-out shaft and a second pull-out shaft that are pulled out and extended away from the housing of the lighting tester, at least one of the first pull-out shaft and the second pull-out shaft being coated with an electrically insulating material, the first pull-out shaft configured to be in electrical communication with the second pull-out shaft,
    wherein the first pull-out shaft is the first of the first and second pull-out shafts to be extended from the lighting tester, and the first pull-out shaft is the last of the first and second pull-out shafts to retract into the lighting tester;
    the housing containing
        a first test circuit configured to generate a test voltage signal, the test voltage signal capable of being applied via the antenna to a lamp and ionizing a gas within the lamp,
        a second test circuit configured to receive a signal associated with a lighting ballast, the signal capable of being received without contacting the lighting ballast, and determine whether the signal is indicative of a high-frequency voltage generated by the lighting ballast, and
        a third test circuit configured to receive a first terminal and a second terminal of the lamp and test a filament of the lamp for continuity;
        a worklight configured for use in conjunction with at least one of the first test circuit, the second test circuit, and the third test circuit; and
        at least one output device configured to provide a signal indicative of the operation of at least one of the first test circuit, the second test circuit, and the third test circuit.

2. The lighting tester of claim 1, wherein the one or more types of lamps include at least one of low-pressure discharge fluorescent lamps, high-pressure discharge fluorescent lamps, and high-intensity discharge fluorescent lamps.

3. The lighting tester of claim 1, further comprising at least one selection device configured to select one of the first test circuit, the second test circuit, and the third test circuit.

4. The lighting tester of claim 1, wherein the lighting tester is configured for single-handed operation.

5. The lighting tester of claim 1, further comprising a non-contact voltage detector.

6. A lighting tester for testing one or more types of lamps, the lighting tester comprising:
    a housing containing
        a first test circuit configured to generate a test voltage signal, the test voltage signal capable of being applied to a lamp and ionizing a gas within the lamp,
        a second test circuit configured to receive a signal associated with a lighting ballast and determine whether the signal is indicative of a high-frequency voltage generated by the lighting ballast, and
        a third test circuit configured to receive a first terminal and a second terminal of the lamp and test a filament of the lamp for continuity; and
        an antenna coupled to the housing and including a first pull-out shaft and a second pull-out shaft that are pulled out and extended away from the housing of the lighting tester, at least one of the first pull-out shaft and the second pull-out shaft being coated with an electrically insulating material, the first pull-out shaft configured to be in electrical communication with the second pull-out shaft,
    wherein the first pull-out shaft is the first of the first and second pull-out shafts to be extended from the lighting tester, and the first pull-out shaft is the last of the first and second pull-out shafts to retract into the lighting tester.

7. The lighting tester of claim 6, further comprising a worklight configured for use in conjunction with at least one of the first test circuit, the second test circuit, and the third test circuit.

8. The lighting tester of claim 6, further comprising at least one display device configured to provide a signal indicative of the operation of at least one of the first test circuit, the second test circuit, and the third test circuit.

9. The lighting tester of claim 6, wherein the one or more types of lamps include at least one of low-pressure discharge fluorescent lamps, high-pressure discharge fluorescent lamps, and high-intensity discharge fluorescent lamps.

10. The lighting tester of claim 6, further comprising a rotary dial configured to select one of the first test circuit, the second test circuit, and the third test circuit.

11. The lighting tester of claim 6, wherein the lighting tester is configured for single-handed operation.

12. The lighting tester of claim 6, wherein the lighting tester is configured to be powered by one or more batteries.

13. A lighting tester for testing one or more types of lamps, the lighting tester comprising:
    a housing;
    an antenna coupled to the housing and including a first pull-out shaft and a second pull-out shaft that are pulled out and extended away from the housing of the lighting tester, at least one of the first pull-out shaft and the second pull-out shaft being coated with an electrically insulating material, wherein the first pull-out shaft is in electrical communication with the second pull-out shaft,
    wherein the first pull-out shaft is the first of the first and second pull-out shafts to be extended from the lighting tester, and the first pull-out shaft is the last of the first and second pull-out shafts to retract into the lighting tester;
    the housing containing
        a first test circuit configured to generate a test voltage signal, the test voltage signal capable of being applied via the antenna to a lamp and ionizing a gas within the lamp,
        a second test circuit configured to receive a signal associated with a lighting ballast and determine whether the signal is indicative of a high-frequency voltage generated by the lighting ballast, and
        a third test circuit configured to receive a first terminal and a second terminal of the lamp and test a filament of the lamp for continuity; and
    a worklight configured for use in conjunction with at least one of the first test circuit, the second test circuit, and the third test circuit.

14. The lighting tester of claim 13, further comprising at least one display device configured to provide a signal indicative of the operation of at least one of the first test circuit, the second test circuit, and the third test circuit.

15. The lighting tester of claim 13, wherein the one or more types of lamps include at least one of low-pressure discharge fluorescent lamps, high-pressure discharge fluorescent lamps, and high-intensity discharge fluorescent lamps.

16. The lighting tester of claim 13, further comprising a rotary dial configured to select one of the first test circuit, the second test circuit, and the third test circuit.

17. The lighting tester of claim 13, wherein the lighting tester is configured for single-handed operation.

18. A lighting tester for testing a lamp, the lighting tester comprising:
a housing;
an antenna coupled to the housing and including a first pull-out shaft and a second pull-out shaft that are pulled out and extended away from the housing of the lighting tester, at least one of the first pull-out shaft and the second pull-out shaft being coated with an electrically insulating material, the first pull-out shaft configured to be in electrical communication with the second pull-out shaft,
wherein the first pull-out shaft is the first of the first and second pull-out shafts to be extended from the lighting tester, and the first pull-out shaft is the last of the first and second pull-out shafts to retract into the lighting tester;
the housing including
a first test circuit configured to generate a test voltage signal, the test voltage signal capable of being applied via the antenna to the lamp and ionizing a gas within the lamp, wherein the antenna is detachably coupled to the housing,
a second test circuit configured to receive a signal associated with a voltage generated by a lighting ballast, the signal capable of being received without contacting the lighting ballast, and
a third test circuit configured to receive a first terminal and a second terminal of the lamp and test a filament of the lamp for continuity;
a control button configured to activate at least one of the first test circuit, the second test circuit, and the third test circuit; and
an output device operable to provide a signal indicative of a test result of at least one of the first test circuit, the second test circuit, and the third test circuit.

19. The lighting tester of claim 18, wherein the antenna is detachably coupled to the housing via a fastening device.

20. The lighting tester of claim 19, wherein the fastening device is a bolt.

21. The lighting tester of claim 18, wherein the one or more types of lamps include at least one of low-pressure discharge fluorescent lamps, high-pressure discharge fluorescent lamps, and high-intensity discharge fluorescent lamps.

22. The lighting tester of claim 18, wherein the lighting tester is configured for single-handed operation.

23. The lighting tester of claim 18, wherein the second test circuit is not operative when the first test circuit is operative.

24. The lighting tester of claim 18, wherein the output device is an LED.

25. The lighting tester of claim 24, further comprising a buzzer operable to provide a signal indicative of a test result of at least one of the first test circuit, the second test circuit, and the third test circuit.

* * * * *